(12) United States Patent
Kano et al.

(10) Patent No.: US 11,251,800 B2
(45) Date of Patent: Feb. 15, 2022

(54) FREQUENCY DIVIDER CIRCUIT, DEMULTIPLEXER CIRCUIT, AND SEMICONDUCTOR INTEGRATED CIRCUIT

(71) Applicant: SOCIONEXT INC., Yokohama (JP)

(72) Inventors: Hideki Kano, Yokohama (JP); Tatsuya Sakae, Yokohama (JP)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 17/098,071

(22) Filed: Nov. 13, 2020

(65) Prior Publication Data

US 2021/0067165 A1 Mar. 4, 2021

Related U.S. Application Data

(60) Division of application No. 16/126,908, filed on Sep. 10, 2018, now Pat. No. 10,868,552, which is a
(Continued)

(51) Int. Cl.
*H03L 7/183* (2006.01)
*H03K 23/00* (2006.01)
(Continued)

(52) U.S. Cl.
CPC ........... *H03L 7/183* (2013.01); *H03K 5/1565* (2013.01); *H03K 23/00* (2013.01); *H03K 23/667* (2013.01)

(58) Field of Classification Search
None
See application file for complete search history.

(56) References Cited

U.S. PATENT DOCUMENTS 5,086,438 A * 2/1992 Sugata ................. H04J 3/07
370/514
10,348,316 B2 7/2019 Matsuda
(Continued)

FOREIGN PATENT DOCUMENTS

CN 101383675 A 3/2009
CN 102160292 A 8/2011
(Continued)

OTHER PUBLICATIONS

Chinese Office Action related to Chinese Patent Application No. 201680083326.2 dated Jul. 2, 2021.
(Continued)

*Primary Examiner* — Cassandra F Cox
(74) *Attorney, Agent, or Firm* — Arent Fox LLP (57) ABSTRACT

A frequency divider circuit includes: a first frequency dividing circuit configured to divide a first clock signal to generate a first frequency-divided clock signal; a second frequency dividing circuit configured to divide a second clock signal having the same frequency as the first clock signal and having a first phase difference with respect to the first clock signal to generate a second frequency-divided clock signal; a detection circuit configured to detect a phase relationship between the first frequency-divided clock signal and the second frequency-divided clock signal; and a selection circuit configured to select and output one of the second frequency-divided clock signal and an inverted signal of the second frequency-divided clock signal which are generated by the second frequency dividing circuit, based on the phase relationship between the first frequency-divided clock signal and the second frequency-divided clock signal detected by the detection circuit.

6 Claims, 5 Drawing Sheets

Related U.S. Application Data continuation of application No. PCT/JP2016/057719, filed on Mar. 11, 2016.

(51) Int. Cl.
*H03K 5/156* (2006.01)
*H03K 23/66* (2006.01)

(56) References Cited

U.S. PATENT DOCUMENTS

| | | |
|---|---|---|
| 2008/0001645 A1 | 1/2008 | Kuroki |
| 2008/0169946 A1 | 7/2008 | Shin et al. |
| 2009/0154542 A1 | 6/2009 | Ding et al. |
| 2010/0007389 A1 | 1/2010 | Li et al. |
| 2011/0291715 A1 | 12/2011 | Sogawa et al. |
| 2012/0056644 A1 | 3/2012 | Kondou |
| 2013/0249719 A1 | 9/2013 | Ryan |

FOREIGN PATENT DOCUMENTS

| | | |
|---|---|---|
| CN | 102318192 A | 1/2012 |
| CN | 102609386 A | 7/2012 |
| CN | 104079296 A | 10/2014 |
| EP | 2843564 A1 | 3/2015 |
| JP | 63-306732 A | 12/1988 |
| JP | H02-194721 A | 8/1990 |
| JP | H02194721 A | 8/1990 |
| JP | 4-127617 A | 4/1992 |
| JP | 2007-243617 A | 9/2007 |
| JP | 2012-060319 A | 3/2012 |
| JP | 2017-060050 A | 3/2017 |
| WO | WO 2010/097846 A1 | 9/2010 |

OTHER PUBLICATIONS

European Search Report issued by the European Patent Office in corresponding European Patent Application No. 19214280.0, dated Feb. 26, 2020.

Extended European Search report issued in Patent Application No. 16893518.7 dated May 10, 2019.

Notice of Reasons of Refusal issued by the Japanese Patent Office in corresponding Japanese Patent Application No. 2018-503958, dated Apr. 14, 2020.

International Search Report of related International Patent Application No. PCT/JP2016/057719 dated May 31, 2016.

Communication dated Nov. 30, 2021, issued by the Japanese Patent Office in related Japanese Patent Application No. 2021-001305.

\* cited by examiner

FREQUENCY DIVIDER CIRCUIT, DEMULTIPLEXER CIRCUIT, AND SEMICONDUCTOR INTEGRATED CIRCUIT

CROSS-REFERENCE TO RELATED APPLICATIONS

This application is a divisional of Ser. No. 16/126,908, filed on Sep. 10, 2018, which is a continuation application of International Application PCT/JP2016/057719 filed on Mar. 11, 2016, and designated the U.S., the entire contents of the prior applications are incorporated herein by reference.

FIELD

The present invention relates to a frequency divider circuit, a demultiplexer circuit, and a semiconductor integrated circuit.

BACKGROUND

Figure 7:
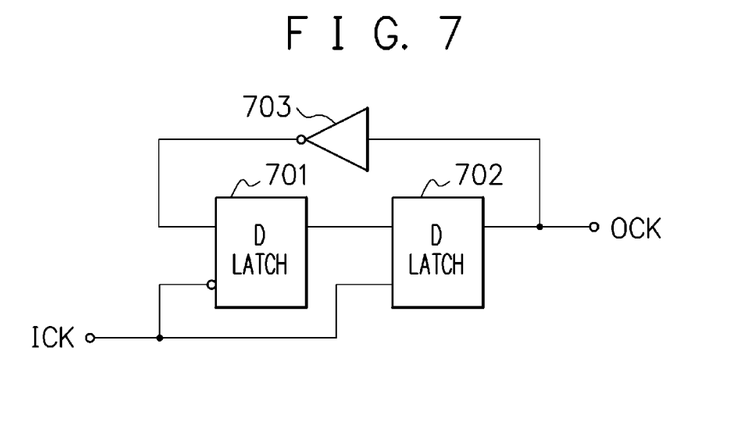
FIG. 7 is a diagram illustrating a configuration example of a frequency divider circuit.

A frequency divider circuit divides an inputted clock signal by N and outputs a clock signal having a cycle of N times (a frequency of 1/N times). FIG. 7 is a diagram illustrating a configuration example of the frequency divider circuit. FIG. 7 illustrates, as an example, a frequency divider circuit that divides an inputted clock signal ICK by two and outputs a frequency-divided clock signal OCK having a cycle of two times.

The frequency divider circuit illustrated in FIG. 7 includes a D flip-flop circuit composed of two D latch circuits 701, 702, and an inverter 703. An output of the D latch circuit 701 is inputted into the D latch circuit 702, and an output of the D latch circuit 702 is inputted into the D latch circuit 701 via the inverter 703. Further, the output of the D latch circuit 702 is outputted as the frequency-divided clock signal OCK.

Each of the D latch circuits 701, 702 is driven by the clock signal ICK to transmit a data (signal) input to the output when a clock input is active (true) and to hold an output state when the clock input is inactive (false). More specifically, in FIG. 7, when the clock signal ICK is at low level, the D latch circuit 701 transmits the data input to the output and the D latch circuit 702 holds the output. Besides, when the clock signal ICK is at high level, the D latch circuit 701 holds the output and the D latch circuit 702 transmits the data input to the output.

Accordingly, in the frequency divider circuit illustrated in FIG. 7, the output of the D latch circuit 702 outputted as the frequency-divided clock signal OCK is inverted every time the clock signal ICK rises (changes from low level to high level). This generates the frequency-divided clock signal OCK made by dividing the inputted clock signal ICK by two.

Here, a case where the frequency divider circuit illustrated in FIG. 7 divides each of a first clock signal and a second clock signal having the same frequency as the first clock signal and having a phase difference with respect to the first clock signal is considered. The output of the frequency divider circuit illustrated in FIG. 7 has an uncertainty of 180 degrees in the phase of the frequency-divided clock signal by the logic at the time of reset, so that the phase relationship between the two frequency-divided clock signals obtained is not uniquely decided.

Figure 8A:
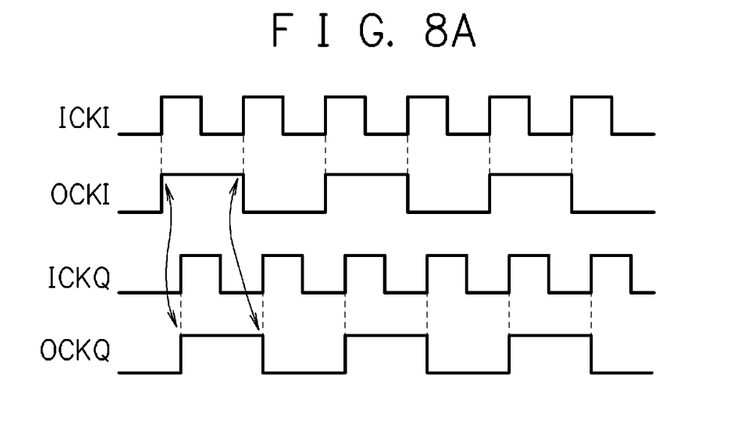
FIG. 8A is a chart illustrating an operation example of the frequency divider circuit illustrated in FIG. 7.
Figure 8B:
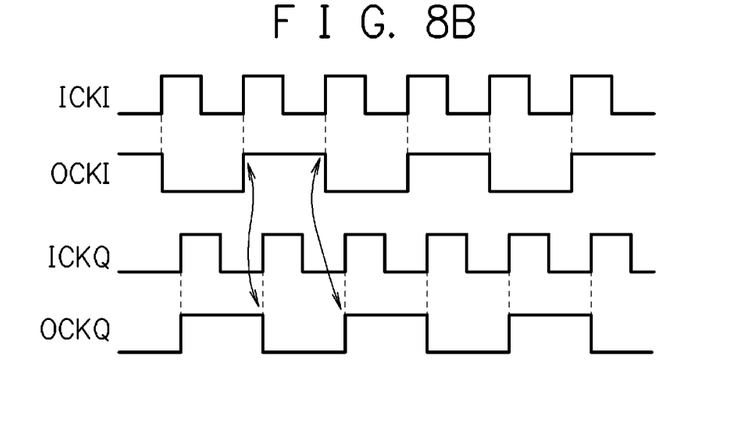
FIG. 8B is a chart illustrating an operation example of the frequency divider circuit illustrated in FIG. 7.

For example, the phase relationship between a frequency-divided clock signal OCKI and a frequency-divided clock signal OCKQ obtained by dividing the clock signal ICKI and a clock signal ICKQ having a phase difference of 90 degrees respectively may become a phase relationship illustrated in FIG. 8A or may become a phase relationship illustrated in FIG. 8B. In FIG. 8A, the frequency-divided clock signal OCKQ rises after the frequency-divided clock signal OCKI rises, and the frequency-divided clock signal OCKQ falls after the frequency-divided clock signal OCKI falls. Besides, in FIG. 8B, the frequency-divided clock signal OCKQ falls after the frequency-divided clock signal OCKI rises, and the frequency-divided clock signal OCKQ rises after the frequency-divided clock signal OCKI falls. In short, the phase relationship may be the same between the input and the output in some cases or the phase relationship may be opposite between the input and the output in some cases.

It is possible to control the frequency-divided clock signal OCKI and the frequency-divided clock signal OCKQ to have a desired phase relationship by control of the logic at the time of reset and control of the order of clock signals after releasing the reset. However, if the inputted clock signals ICKI, ICKQ become unstable such as being suddenly inverted due to influence of noise or the like during operation, the phase relationship between the frequency-divided clock signal OCKI and the frequency-divided clock signal OCKQ sometimes changes.

There is proposed a clock generating device that divides a single clock signal by a plurality of frequency divider circuits to generate a plurality of frequency-divided clock signals coincident in phase, in which when non-coincidence in phase between the frequency-divided clock signals outputted from the plurality of frequency divider circuits is detected, internal states of all of the frequency divider circuits are made into the same state at the same time to be forcibly coincident, thereby making the phases of the frequency-divided clock signals coincident (for example, Patent Literature 1). There is also proposed a method of frequency-dividing a phase difference pulse signal for dividing an input phase difference pulse signal composed of two input pulse train signals to generate two output pulse train signals having a longer frequency and the same phase relationship (for example, Patent Literature 2).

Patent Literature 1: Japanese Laid-open Patent Publication No. 63-306732

Patent Literature 2: Japanese Laid-open Patent Publication No. 4-127617

SUMMARY

One aspect of a frequency divider circuit includes: a first frequency dividing circuit configured to divide a first clock signal to generate a first frequency-divided clock signal; a second frequency dividing circuit configured to divide a second clock signal having the same frequency as the first clock signal and having a first phase difference with respect to the first clock signal to generate a second frequency-divided clock signal; a detection circuit configured to detect a phase relationship between the first frequency-divided clock signal and the second frequency-divided clock signal; and a selection circuit configured to select and output one of the second frequency-divided clock signal and an inverted signal of the second frequency-divided clock signal which are generated by the second frequency dividing circuit. The selection circuit is configured to select one of the second frequency-divided clock signal and the inverted signal of the second frequency-divided clock signal, based on the phase relationship between the first frequency-divided clock signal and the second frequency-divided clock signal detected by the detection circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments of the present invention will be described on the basis of the drawings.

Figure 1:
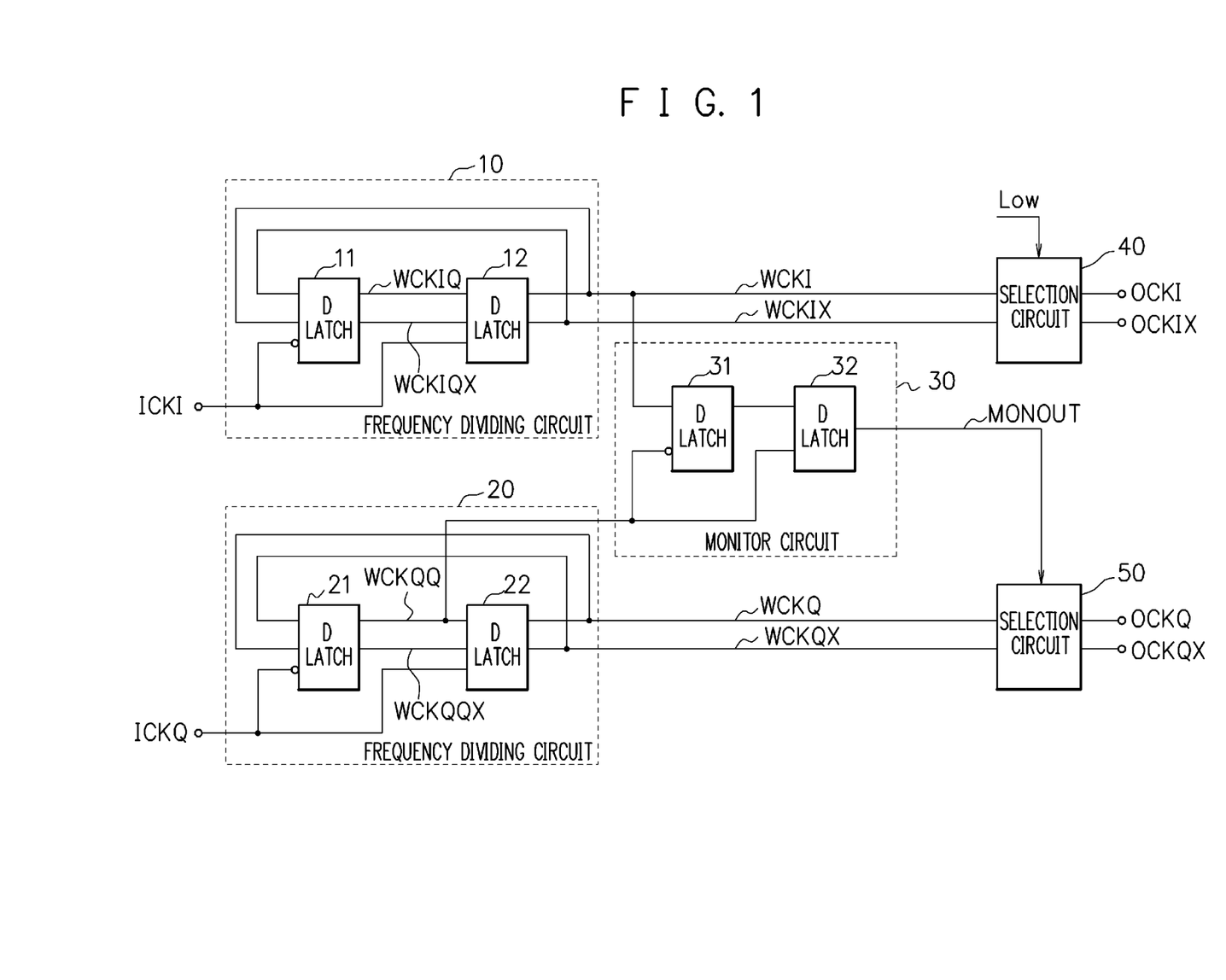
FIG. 1 is a diagram illustrating a configuration example of a frequency divider circuit in an embodiment of the present invention.

FIG. 1 is a diagram illustrating a configuration example of a frequency divider circuit in one embodiment of the present invention. The frequency divider circuit in this embodiment includes a first frequency dividing circuit 10, a second frequency dividing circuit 20, a monitor circuit 30, a first selection circuit 40, and a second selection circuit 50.

The first frequency dividing circuit 10 receives input of a clock signal ICKI and divides the inputted clock signal ICKI to generate frequency-divided clock signals WCKI, WCKIX. The frequency-divided clock signals WCKI, WCKIX are differential signals inverted in phase to each other. The first frequency dividing circuit 10 includes two D latch circuits 11, 12 constituting a D flip-flop circuit. The D latch circuits 11, 12 are configured such that data input and data output form a differential configuration.

A data output WCKIQ on the positive side of the D latch circuit 11 is inputted into a data input on the positive side of the D latch circuit 12, and a data output WCKIQX on the negative side of the D latch circuit 11 is inputted into a data input on the negative side of the D latch circuit 12. Further, a data output WCKI on the positive side of the D latch circuit 12 is inputted into a data input on the negative side of the D latch circuit 11, and a data output WCKIX on the negative side of the D latch circuit 12 is inputted into a data input on the positive side of the D latch circuit 11.

Each of the D latch circuits 11, 12 is driven by the clock signal ICKI to transmit a data (signal) input to the output when a clock input is active (true) and to hold an output state when the clock input is inactive (false). More specifically, in the first frequency dividing circuit 10, when the clock signal ICKI is at low level, the D latch circuit 11 transmits the data input to the data output and the D latch circuit 12 holds the data output. Besides, when the clock signal ICKI is at high level, the D latch circuit 11 holds the data output and the D latch circuit 12 transmits the data input to the data output.

Accordingly, in the first frequency dividing circuit 10, the data outputs WCKI, WCKIX of the D latch circuit 12 as the frequency-divided clock signals are inverted every time the clock signal ICKI rises (changes from low level to high level). Thus, the frequency-divided clock signal WCKI made by dividing the inputted clock signal ICKI by two and the frequency-divided clock signal WCKIX being the inverted signal of the frequency-divided clock signal WCKI are generated.

The second frequency dividing circuit 20 receives input of a clock signal ICKQ and divides the inputted clock signal ICKQ to generate frequency-divided clock signals WCKQ, WCKQX. The frequency-divided clock signals WCKQ, WCKQX are differential signals inverted in phase to each other. The clock signal ICKQ is a clock signal having the same frequency as the clock signal ICKI and having a certain phase difference with respect to the clock signal ICKI, the clock signal ICKQ is assumed to be a clock signal delayed by 90 degrees in phase from the clock signal ICKI in this example. The second frequency dividing circuit 20 includes two D latch circuits 21, 22 constituting a D flip-flop circuit. The D latch circuits 21, 22 are configured such that data input and data output form a differential configuration.

A data output WCKQQ on the positive side of the D latch circuit 21 is inputted into a data input on the positive side of the D latch circuit 22, and a data output WCKQQX on the negative side of the D latch circuit 21 is inputted into a data input on the negative side of the D latch circuit 22. Further, a data output WCKQ on the positive side of the D latch circuit 22 is inputted into a data input on the negative side of the D latch circuit 21, and a data output WCKQX on the negative side of the D latch circuit 22 is inputted into a data input on the positive side of the D latch circuit 21.

Each of the D latch circuits 21, 22 is driven by the clock signal ICKQ, and transmits data (signal) input to the output when a clock input is active (true) and to hold an output state when the clock input is inactive (false). More specifically, in the second frequency dividing circuit 20, when the clock signal ICKQ is at low level, the D latch circuit 21 transmits the data input to the data output and the D latch circuit 22 holds the data output. Besides, when the clock signal ICKQ is at high level, the D latch circuit 21 holds the data output and the D latch circuit 22 transmits the data input to the data output.

Accordingly, in the second frequency dividing circuit 20, the data outputs WCKQ, WCKQX of the D latch circuit 22 as the frequency-divided clock signals are inverted every time the clock signal ICKQ rises (changes from low level to high level). Thus, the frequency-divided clock signal WCKQ made by dividing the inputted clock signal ICKQ by two and the frequency-divided clock signal WCKQX being the inverted signal of the frequency-divided clock signal WCKQ are generated.

The monitor circuit 30 detects the phase relationship between the frequency-divided clock signal WCKI generated by the first frequency dividing circuit 10 and the frequency-divided clock signal WCKQ generated by the second frequency dividing circuit 20. The monitor circuit 30 outputs a monitor signal MONOUT indicating the phase relationship between the frequency-divided clock signal WCKI and the frequency-divided clock signal WCKQ.

The monitor circuit 30 includes two D latch circuits 31, 32. The frequency-divided clock signal WCKI generated by the first frequency dividing circuit 10 is inputted into a data input of the D latch circuit 31, and a data output of the D latch circuit 31 is inputted into a data input of the D latch circuit 32. A data output of the D latch circuit 32 is outputted as the monitor signal MONOUT.

Each of the D latch circuits 31, 32 is driven by the data output WCKQQ on the positive side of the D latch circuit 21 included in the second frequency dividing circuit 20. The monitor circuit 30 transmits a data (signal) input to the output when the data output WCKQQ as a clock input is active (true) and holds an output state when the clock input is inactive (false). More specifically, in the monitor circuit 30, when the data output WCKQQ is at low level, the D latch circuit 31 transmits the data input to the data output and the D latch circuit 32 holds the data output. Besides, when the data output WCKQQ is at high level, the D latch circuit 31 holds the data output and the D latch circuit 32 transmits the data input to the data output.

Figure 2A:
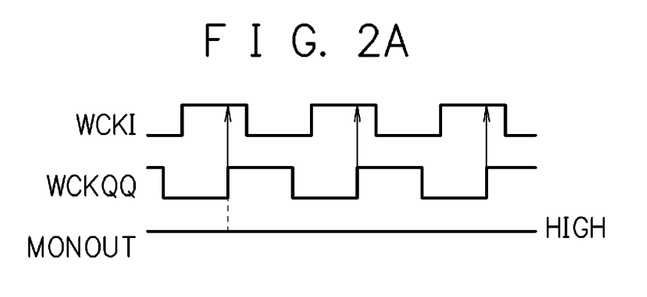
FIG. 2A is a chart illustrating an operation example of a monitor circuit in this embodiment.

In the monitor circuit 30 having the above configuration, in the case where the phase relationship between the frequency-divided clock signal WCKI and the data output WCKQQ is as illustrated in FIG. 2A, the monitor signal MONOUT becomes high level. In the case where the frequency-divided clock signal WCKI and the data output WCKQQ are in the phase relationship as illustrated in FIG. 2A, the phase relationship between the frequency-divided clock signal WCKI generated by the first frequency dividing circuit 10 and the frequency-divided clock signal WCKQ generated by the second frequency dividing circuit 20 becomes opposite to the phase relationship between the clock signal ICKI and the clock signal ICKQ. In other words, the frequency-divided clock signal WCKQ is ahead in phase of the frequency-divided clock signal WCKI. Thus, the monitor circuit 30 outputs the monitor signal MONOUT at high level in the case where the phase relationship between the frequency-divided clock signal WCKI and the frequency-divided clock signal WCKQ is opposite to the phase relationship between the clock signal ICKI and the clock signal ICKQ.

Figure 2B:
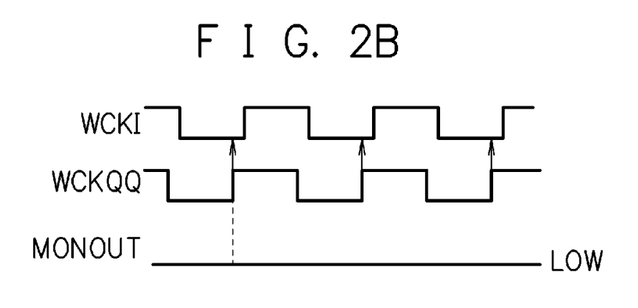
FIG. 2B is a chart illustrating an operation example of the monitor circuit in this embodiment.

Besides, in the monitor circuit 30, in the case where the phase relationship between the frequency-divided clock signal WCKI and the data output WCKQQ is as illustrated in FIG. 2B, the monitor signal MONOUT becomes low level. In the case where the frequency-divided clock signal WCKI and the data output WCKQQ are in the phase relationship as illustrated in FIG. 2B, the phase relationship between the frequency-divided clock signal WCKI generated by the first frequency dividing circuit 10 and the frequency-divided clock signal WCKQ generated by the second frequency dividing circuit 20 is the same as the phase relationship between the clock signal ICKI and the clock signal ICKQ. In other words, the frequency-divided clock signal WCKQ is delayed in phase from the frequency-divided clock signal WCKI. Thus, the monitor circuit 30 outputs the monitor signal MONOUT at low level in the case where the phase relationship between the frequency-divided clock signal WCKI and the frequency-divided clock signal WCKQ is the same as the phase relationship between the clock signal ICKI and the clock signal ICKQ.

The first selection circuit 40 receives input of the frequency-divided clock signal WCKI and the frequency-divided clock signal WCKIX being the inverted signal thereof which are generated by the first frequency dividing circuit 10. The first selection circuit 40 outputs one of the frequency-divided clock signal WCKI and the frequency-divided clock signal WCKIX as a frequency-divided clock signal OCKI and outputs the other of the frequency-divided clock signal WCKI and the frequency-divided clock signal WCKIX as a frequency-divided clock signal OCKIX, according to the inputted selection signal.

In the example illustrated in FIG. 1, the selection signal inputted into the first selection circuit 40 is at low level, and the first selection circuit 40 outputs at all times the frequency-divided clock signal WCKI as the frequency-divided clock signal OCKI and the frequency-divided clock signal WCKIX as the frequency-divided clock signal OCKIX. Here, in the example illustrated in FIG. 1, since selection of the output of the first selection circuit 40 is fixed, the first selection circuit 40 does not have to be provided in terms of function, but the first selection circuit 40 is provided to form the transmission paths of the frequency-divided clock signals in the same configuration, thereby making it possible to uniform transmission characteristics such as delay, load and so on.

The second selection circuit 50 receives input of the frequency-divided clock signal WCKQ and the frequency-divided clock signal WCKQX being the inverted signal thereof which are generated by the second frequency dividing circuit 20. The second selection circuit 50 outputs one of the frequency-divided clock signal WCKQ and the frequency-divided clock signal WCKQX as a frequency-divided clock signal OCKQ and outputs the other of the frequency-divided clock signal WCKQ and the frequency-divided clock signal WCKQX as a frequency-divided clock signal OCKQX, according to the monitor signal MONOUT inputted as a selection signal.

Figure 3:
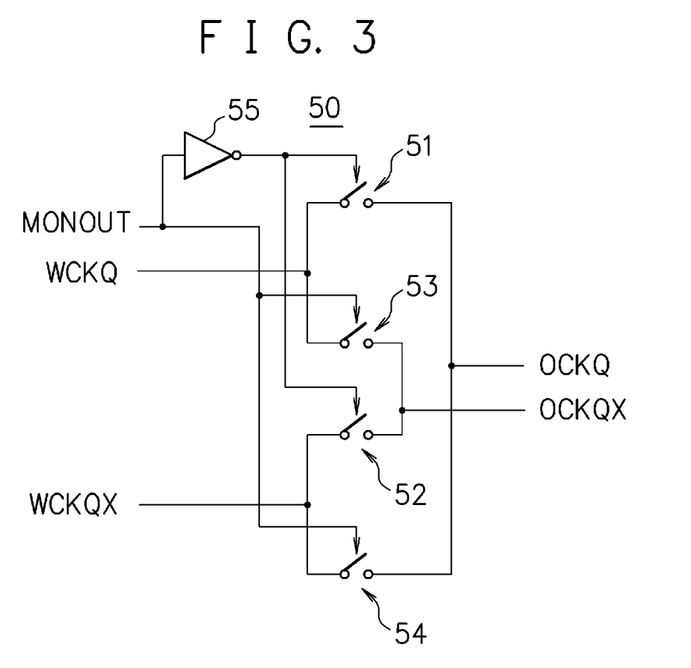
FIG. 3 is a diagram illustrating a configuration example of a selection circuit in this embodiment.

FIG. 3 is a diagram illustrating a configuration example of the second selection circuit 50. The second selection circuit 50 includes switches 51, 52, 53, 54 and an inverter 55. The switch 51 is arranged between a signal line of the frequency-divided clock signal WCKQ and a signal line of the frequency-divided clock signal OCKQ, and the switch 52 is arranged between a signal line of the frequency-divided clock signal WCKQX and a signal line of the frequency-divided clock signal OCKQX. Further, the switch 53 is arranged between the signal line of the frequency-divided clock signal WCKQ and the signal line of the frequency-divided clock signal OCKQX, and the switch 54 is arranged between the signal line of the frequency-divided clock signal WCKQX and the signal line of the frequency-divided clock signal OCKQ.

The switches 51, 52 are controlled by the monitor signal MONOUT supplied via the inverter 55, and the switches 53, 54 are controlled by the monitor signal MONOUT. Specifically, the switches 51, 52 become a conductive state (closed state) when the monitor signal MONOUT is at low level, and become a non-conductive state (open state) when the monitor signal MONOUT is at high level. On the other hand, the switches 53, 54 become a conductive state (closed state) when the monitor signal MONOUT is at high level, and become a non-conductive state (open state) when the monitor signal MONOUT is at low level.

Accordingly, the second selection circuit 50 outputs the frequency-divided clock signal WCKQ as the frequency-divided clock signal OCKQ and outputs the frequency-divided clock signal WCKQX as the frequency-divided clock signal OCKQX when the monitor signal MONOUT inputted as the selection signal is at low level. Further, the second selection circuit 50 outputs the frequency-divided clock signal WCKQX as the frequency-divided clock signal OCKQ and outputs the frequency-divided clock signal WCKQ as the frequency-divided clock signal OCKQX when the monitor signal MONOUT is at high level.

The frequency divider circuit in this embodiment illustrated in FIG. 1 outputs the frequency-divided clock signal WCKQ as the frequency-divided clock signal OCKQ when the monitor signal MONOUT is at low level, namely, the phase relationship between the frequency-divided clock signal WCKI generated by the first frequency dividing circuit 10 and the frequency-divided clock signal WCKQ generated by the second frequency dividing circuit 20 is the same as the phase relationship between the clock signal ICKI and the clock signal ICKQ. On the other hand, the frequency divider circuit outputs the frequency-divided clock signal WCKQX being the inverted signal of the frequency-divided clock signal WCKQ as the frequency-divided clock signal OCKQ when the monitor signal MONOUT is at high level, namely, the phase relationship between the frequency-divided clock signal WCKI generated by the first frequency dividing circuit 10 and the frequency-divided clock signal WCKQ generated by the second frequency dividing circuit 20 is opposite to the phase relationship between the clock signal ICKI and the clock signal ICKQ.

Figure 4:
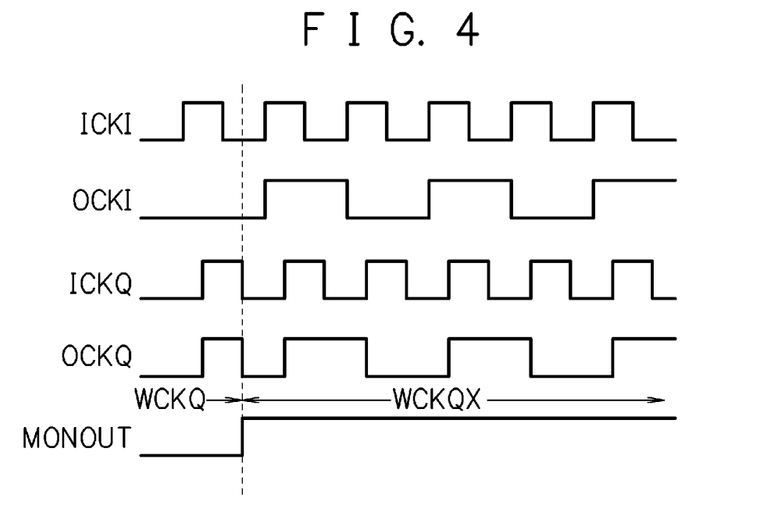
FIG. 4 is a chart illustrating an operation example of a frequency divider circuit in this embodiment.

Thus, for example, it is assumed that the phase relationship between the frequency-divided clock signal WCKI generated by the first frequency dividing circuit 10 and the frequency-divided clock signal WCKQ generated by the second frequency dividing circuit 20 is the same as the phase relationship between the clock signal ICKI and the clock signal ICKQ and the frequency-divided clock signal WCKQ is outputted as the frequency-divided clock signal OCKQ as illustrated in FIG. 4. Namely, it is assumed that the frequency-divided clock signal WCKQ is outputted as the frequency-divided clock signal OCKQ so that the phase relationship with respect to the frequency-divided clock signal OCKI becomes the same as the phase relationship between the clock signal ICKI and the clock signal ICKQ.

In this event, when some clock signals are suddenly inverted due to the influence of noise or the like, and the phase relationship between the frequency-divided clock signal WCKI and the frequency-divided clock signal WCKQ becomes opposite to the phase relationship between the clock signal ICKI and the clock signal ICKQ, the monitor signal MONOUT changes to high level, so that the frequency-divided clock signal WCKQX being the inverted signal of the frequency-divided clock signal WCKQ is outputted as the frequency-divided clock signal OCKQ. In other words, the frequency-divided clock signal WCKQX being the inverted signal of the frequency-divided clock signal WCKQ is outputted as the frequency-divided clock signal OCKQ so that the phase relationship with respect to the frequency-divided clock signal OCKI becomes the same as the phase relationship between the clock signal ICKI and the clock signal ICKQ.

Therefore, according to the frequency divider circuit in this embodiment illustrated in FIG. 1, it becomes possible to output the frequency-divided clock signal OCKI and the frequency-divided clock signal OCKQ having the same phase relationship as the phase relationship between the inputted clock signal ICKI and clock signal ICKQ by selectively outputting one of the non-inverted frequency-divided clock signal and the inverted frequency-divided clock signal which are generated by the second frequency dividing circuit 20, according to the phase relationship between the frequency-divided clock signal generated by the first frequency dividing circuit 10 and the frequency-divided clock signal generated by the second frequency dividing circuit 20. For example, even when the phase relationship between the frequency-divided clock signal OCKI and the frequency-divided clock signal OCKQ changes into a state different from the desired phase relationship due to instability of the clock signals, the phase relationship can be automatically recovered to become the desired phase relationship.

Note that the example of outputting the frequency-divided clock signal OCKI and the frequency-divided clock signal OCKQ having the same phase relationship as the phase relationship between the inputted clock signal ICKI and clock signal ICKQ has been described in the above explanation. However, this embodiment is not limited to the above, and it is also possible to output the frequency-divided clock signal OCKI and the frequency-divided clock signal OCKQ having the phase relationship opposite to the phase relationship between the inputted clock signal ICKI and clock signal ICKQ, by appropriately changing the configuration of the second selection circuit 50 or the like.

One of circuits to which the frequency divider circuit in the above-described embodiment is applied is a demultiplexer circuit. The demultiplexer circuit is a circuit that converts a serial data signal into a parallel data signal, in which a frequency-divided clock signal is used for serial-to-parallel conversion. Further, to increase the transmission speed and perform boundary detection for reproduction clock control, not only a single clock signal but also a plurality of clock signals having a certain phase difference are used.

Figure 5:
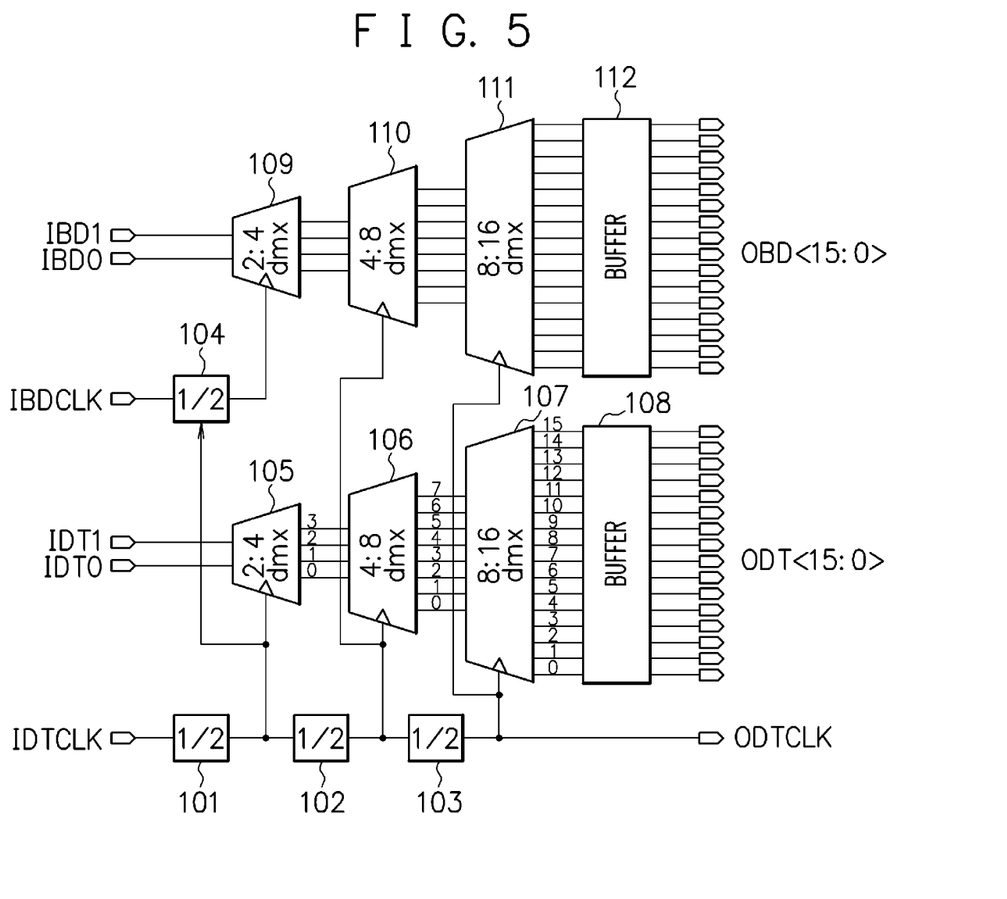
FIG. 5 is a diagram illustrating a configuration example of a demultiplexer circuit in an embodiment of the present invention.

FIG. 5 is diagram illustrating a configuration example of the demultiplexer circuit in this embodiment. Note that in this example, it is assumed that a data signal IDT0 is acquired using a clock signal IDTCLK from the serial data signal and a data signal IDT1 is acquired using an inverted signal (a clock signal having a phase difference of 180 degrees) of the clock signal IDTCLK in a circuit at a preceding stage of the demultiplexer circuit. Further, it is also assumed that a boundary signal IBD0 is acquired using a clock signal IBDCLK from the serial data signal and a boundary signal IBD1 is acquired using an inverted signal (a clock signal having a phase difference of 180 degrees) of the clock signal IBDCLK. Here, it is assumed that the clock signal IBDCLK has a phase difference of 90 degrees with respect to the clock signal IDTCLK and is delayed in phase from the clock signal IDTCLK.

A frequency divider circuit 101 receives input of the clock signal IDTCLK and generates a frequency-divided clock signal made by dividing the clock signal IDTCLK by two. The frequency divider circuit 101 includes a configuration corresponding to the first frequency dividing circuit 10 and the first selection circuit 40 in the frequency divider circuit illustrated in FIG. 1. A frequency divider circuit 102 generates a frequency-divided clock signal made by dividing the frequency-divided clock signal generated by the frequency divider circuit 101 by two, and a frequency divider circuit 103 generates a frequency-divided clock signal made by dividing the frequency-divided clock signal generated by the frequency divider circuit 102 by two. An output of the frequency divider circuit 103 is outputted as a frequency-divided clock ODTCLK, together with parallel output data signal ODT<15:0> and output boundary signal OBD<15:0>.

Further, a frequency divider circuit 104 receives input of the clock signal IBDCLK and generates a frequency-divided clock signal made by dividing the clock signal IBDCLK by two. The frequency divider circuit 104 includes a configuration corresponding to the second frequency dividing circuit 20, the monitor circuit 30, and the second selection circuit 50 in the frequency divider circuit illustrated in FIG. 1. The frequency divider circuit 104 selects one of the frequency-divided clock signal made by dividing the clock signal IBDCLK by two and the inverted signal thereof so that the phase relationship with respect to the frequency-divided clock signal generated by the frequency divider circuit 101 becomes the same as the phase relationship between the clock signal IDTCLK and the clock signal IBDCLK, and outputs it.

A demultiplexing circuit 105 converts a data signal with a 2-bit width composed of the data signal IDT0 and the data signal IDT1 into a data signal with a four-bit width using the frequency-divided clock signal generated by the frequency divider circuit 101. A demultiplexing circuit 106 converts a data signal with a 4-bit width outputted from the demultiplexing circuit 105 into a data signal with an 8-bit width using the frequency-divided clock signal generated by the frequency divider circuit 102.

A demultiplexing circuit 107 converts the data signal with the 8-bit width outputted from the demultiplexing circuit 106 into a data signal with a 16-bit width using the frequency-divided clock signal generated by the frequency divider circuit 103. A buffer 108 outputs the data signal with the 16-bit width outputted from the demultiplexing circuit 107, as the parallel output data signal ODT<15:0>.

A demultiplexing circuit 109 converts a boundary signal with a 2-bit width composed of the boundary signal IBD0 and the boundary signal IBD1 into a boundary signal with a 4-bit width using the frequency-divided clock signal generated by the frequency divider circuit 104. The demultiplexing circuit 109 performs data conversion as described above using the frequency-divided clock signal made by dividing the clock signal IBDCLK, thereby ensuring a timing margin. A demultiplexing circuit 110 converts the boundary signal with the 4-bit width outputted from the demultiplexing circuit 109 into a boundary signal with an 8-bit width using the frequency-divided clock signal generated by the frequency divider circuit 102.

A demultiplexing circuit 111 converts the boundary signal with the 8-bit width outputted from the demultiplexing circuit 110 into a boundary signal with a 16-bit width using the frequency-divided clock signal generated by the frequency divider circuit 103. A buffer 112 outputs the boundary signal with the 16-bit width outputted from the demultiplexing circuit 111, as the parallel output boundary signal OBD<15:0>.

Applying the frequency divider circuit in this embodiment as described above enables data conversion using the frequency-divided clock signal having an appropriate phase relationship when the demultiplexing circuit 109 performs data conversion using the frequency-divided clock signal made by dividing the clock signal IBDCLK having a certain phase difference with respect to the clock signal IDTCLK.

Figure 6:
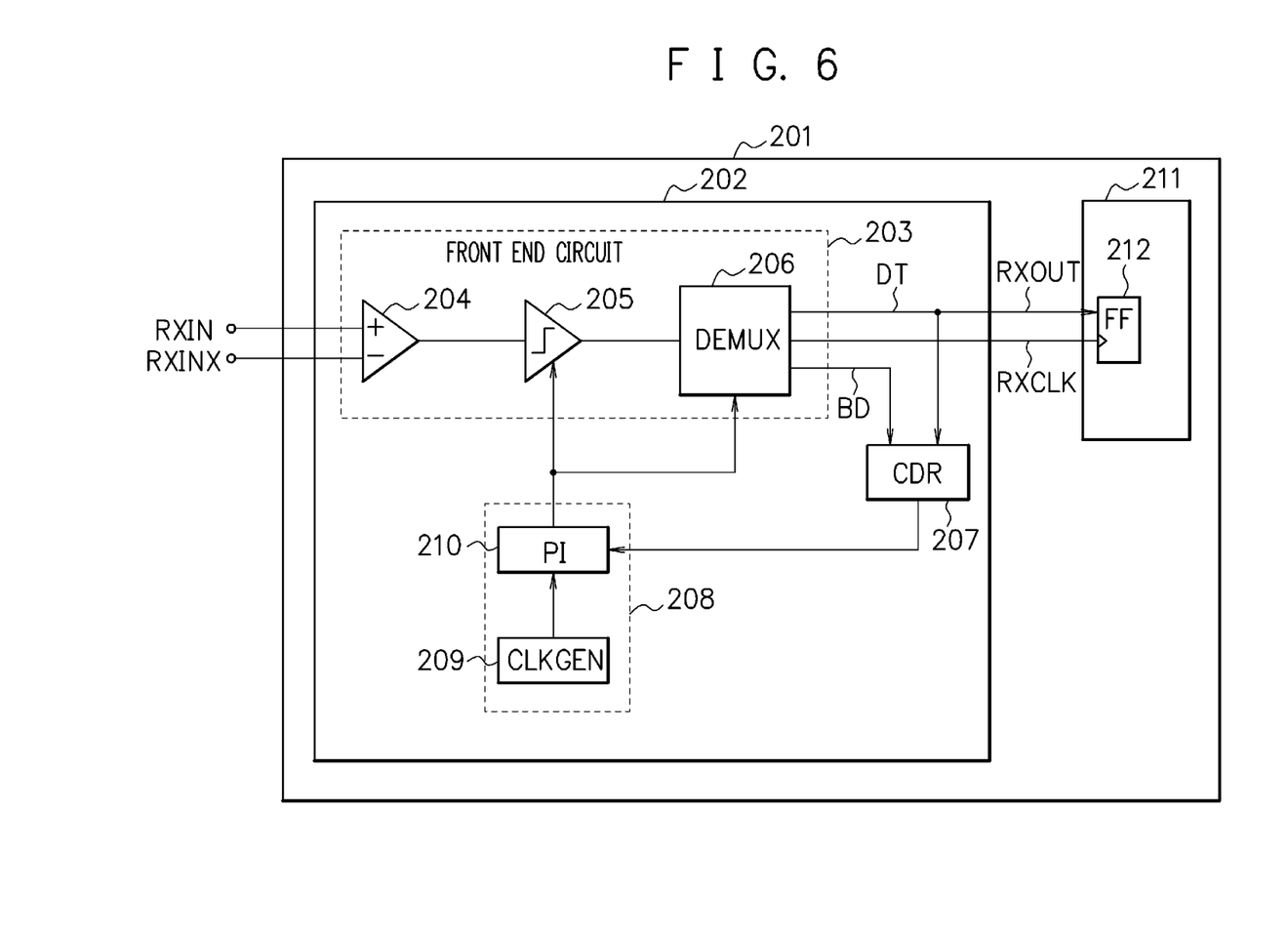
FIG. 6 is a diagram illustrating a configuration example of a semiconductor integrated circuit in an embodiment of the present invention.

FIG. 6 is a diagram illustrating a configuration example of a semiconductor integrated circuit in this embodiment. The semiconductor integrated circuit 201 in this embodiment includes a reception circuit 202 having the function of a deserializer circuit that converts an input serial signal into a parallel signal, and an internal circuit 211 such as a logic circuit that receives the parallel signal (data) from the reception circuit 202 to perform processing operation.

The reception circuit 202 includes a front end circuit 203, a clock data recovery circuit 207, and a clock generation circuit 208. The front end circuit 203 includes a differential buffer 204, a comparator 205, and a demultiplexer circuit 206. The differential buffer 204 receives differential input serial signals RXIN, RXINX transmitted via a transmission path or the like. The comparator 205 determines a code (data) of the input serial signal.

The demultiplexer circuit 206 is, for example, the demultiplexer circuit illustrated in FIG. 5, and performs serial-to-parallel conversion on the output of the comparator 205 to output parallel data signal DT, boundary signal BD, and reception data clock signal. The parallel data signal DT and reception data clock signal outputted from the demultiplexer circuit 206 are outputted to the internal circuit 211 as a reception data signal RXOUT and a reception clock signal RXCLK.

The clock data recovery circuit 207 appropriately controls the phase of an internal clock signal outputted from a clock generation circuit 208, based on the received signal. The clock data recovery circuit 207 determines whether the phase of the internal clock signal outputted from the clock generation circuit 208 is advanced or delayed with respect to the input serial signal, based on the data signal DT and the boundary signal BD outputted from the demultiplexer circuit 206. The clock data recovery circuit 207 further generates and outputs a phase adjustment code for advancing or delaying the phase of the internal clock signal according to the determination result.

The clock generation circuit 208 includes a clock generator 209 and a phase interpolation circuit 210. The clock generator 209 generates a reference clock signal and supplies it to the phase interpolation circuit 210. The phase interpolation circuit 210 controls the phase according to the phase adjustment code from the clock data recovery circuit 207 on the reference clock signal supplied from the clock generator 209, and outputs a resulting signal, as the internal clock signal, to the comparator 205 and the demultiplexer circuit 206.

Using the internal clock signal outputted from the clock generation circuit 208, the comparator 205 performs sampling of the input serial signal at an appropriate timing and the demultiplexer circuit 206 performs serial-to-parallel conversion. The reception data signal RXOUT outputted from the reception circuit 202 is captured into the internal circuit 211 by a flip-flop 212 operating by the reception clock signal RXCLK and subjected to processing and so on.

Note that the above-described embodiments merely illustrate concrete examples in implementing the present invention, and the technical scope of the present invention is not to be construed in a restrictive manner by these embodiments. That is, the present invention may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

As described above, according to the present invention, based on a phase relationship between a first frequency-divided clock signal and a second frequency-divided clock signal, one of the second frequency-divided clock signal and an inverted signal of the second frequency-divided clock signal is selected and outputted. This makes it possible to appropriately select and output the second frequency-divided clock signal and the inverted signal of the second frequency-divided clock signal so as to maintain a desired phase relationship with respect to the first frequency-divided clock signal.

What is claimed is:

1. A demultiplexer circuit comprising:
a first demultiplexing circuit configured to convert a first input signal having a first bit width into a first intermediate signal having a second bit width larger than the first bit width, based on a first conversion clock signal generated by dividing a first clock signal;
a second demultiplexing circuit configured to convert a second input signal having the first bit width and having a first phase difference with respect to the first input signal into a second intermediate signal having the second bit width, based on a second conversion clock signal generated by dividing a second clock signal having the same frequency as the first clock signal and having the first phase difference with respect to the first clock signal;
a first frequency divider circuit configured to divide the first conversion clock signal to generate a third conversion clock signal having a lower frequency than the first conversion clock signal;
a third demultiplexing circuit configured to convert the first intermediate signal into a first output signal having a third bit width larger than the second bit width, based on the third conversion clock signal; and
a fourth demultiplexing circuit configured to convert the second intermediate signal into a second output signal having the third bit width, based on the third conversion clock signal.

2. The demultiplexer circuit according to claim 1, wherein the first phase difference is 90 degrees.

3. The demultiplexer circuit according to claim 1, comprising:
a second frequency divider circuit configured to generate the first conversion clock signal by dividing the first clock signal; and
a third frequency divider circuit configured to generate the second conversion clock signal by dividing the second conversion clock signal, wherein
each of frequency division ratios of the second frequency divider circuit and the third frequency divider circuit is equal to a ratio of the second bit width to the first bit width.

4. The demultiplexer circuit according to claim 3, comprising:
a conversion circuit configured to convert a serial signal into the first input signal and the second input signal, based on the first clock signal and the second clock signal.

5. A semiconductor integrated circuit comprising:
a comparator configured to output a first input signal having a first bit width and a second input signal having the first bit width and having a first phase difference with respect to the first input signal by sampling an input serial signal using a first clock signal and a second clock signal having the same frequency as the first clock signal and having the first phase difference with respect to the first clock signal;
a demultiplexer circuit configured to convert an output signal of the comparator; and
a clock data recovery circuit configured to control phases of the first clock signal and the second clock signal, based on a received signal, wherein
the demultiplexer circuit includes:
a first demultiplexing circuit configured to convert the first input signal into a first intermediate signal having a second bit width larger than the first bit width, based on a first conversion clock signal generated by dividing the first clock signal;
a second demultiplexing circuit configured to convert the second input signal into a second intermediate signal having the second bit width, based on a second conversion clock signal generated by dividing the second clock signal;
a first frequency divider circuit configured to generate a third conversion clock signal having a lower frequency than the first conversion clock signal by dividing the first conversion clock signal;
a third demultiplexing circuit configured to convert the first intermediate signal into a first output signal having a third bit width larger than the second bit width, based on the third conversion clock signal; and
a fourth demultiplexing circuit configured to convert the second intermediate signal into a second output signal having the third bit width, based on the third conversion clock signal.

6. The semiconductor integrated circuit according to claim 5, comprising:
an internal circuit configured to receive at least one of the first output signal and the second output signal from the demultiplexer circuit to perform processing operation.

* * * * *